(12) United States Patent
Badrieh et al.

(10) Patent No.: US 11,568,915 B2
(45) Date of Patent: Jan. 31, 2023

(54) VOLTAGE ADJUSTMENT OF MEMORY DIES BASED ON WEIGHTED FEEDBACK

(71) Applicant: Micron Technology, Inc., Boise, ID (US)

(72) Inventors: Fuad Badrieh, Boise, ID (US); Thomas H. Kinsley, Boise, ID (US); Baekkyu Choi, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/315,711

(22) Filed: May 10, 2021

(65) Prior Publication Data

US 2022/0358988 A1 Nov. 10, 2022

(51) Int. Cl.
*G11C 11/4074* (2006.01)
*G11C 11/22* (2006.01)

(52) U.S. Cl.
CPC ...... *G11C 11/4074* (2013.01); *G11C 11/2297* (2013.01)

(58) Field of Classification Search
CPC ................... G11C 11/4074; G11C 11/2297
USPC .......................................................... 365/149
See application file for complete search history.

(56) References Cited

U.S. PATENT DOCUMENTS

| | | | |
|---|---|---|---|
| 9,287,891 B1* | 3/2016 | Lee | H03M 1/0641 |
| 2013/0311792 A1* | 11/2013 | Ponnathota | G06F 1/26 |
| | | | 713/300 |
| 2020/0104209 A1* | 4/2020 | El Gamal | G11C 29/52 |
| 2020/0194043 A1* | 6/2020 | Karim | G11C 7/1087 |

* cited by examiner

*Primary Examiner* — Hoai V Ho
*Assistant Examiner* — Minh Dinh
(74) *Attorney, Agent, or Firm* — Holland & Hart LLP

(57) ABSTRACT

Methods, systems, and devices for voltage adjustment of memory dies based on weighted feedback are described. A supply voltage may be measured at various areas of a memory die, weights may be applied to the measured voltages based on the area from which the particular voltage was measured. The supply voltage may be adjusted based on the weighted signals. The signals may be weighted using digital or analog techniques. Different durations of time in which oscillations from an oscillator circuit are counted may provide weighting for a signal. Weights applied to the signals may be dynamically adjusted, which may allow the weights to be tuned or changed based on changes to operating conditions of the memory dies.

25 Claims, 6 Drawing Sheets

VOLTAGE ADJUSTMENT OF MEMORY DIES BASED ON WEIGHTED FEEDBACK

FIELD OF TECHNOLOGY

The following relates generally to one or more systems for memory and more specifically to voltage adjustment of memory dies based on weighted feedback.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
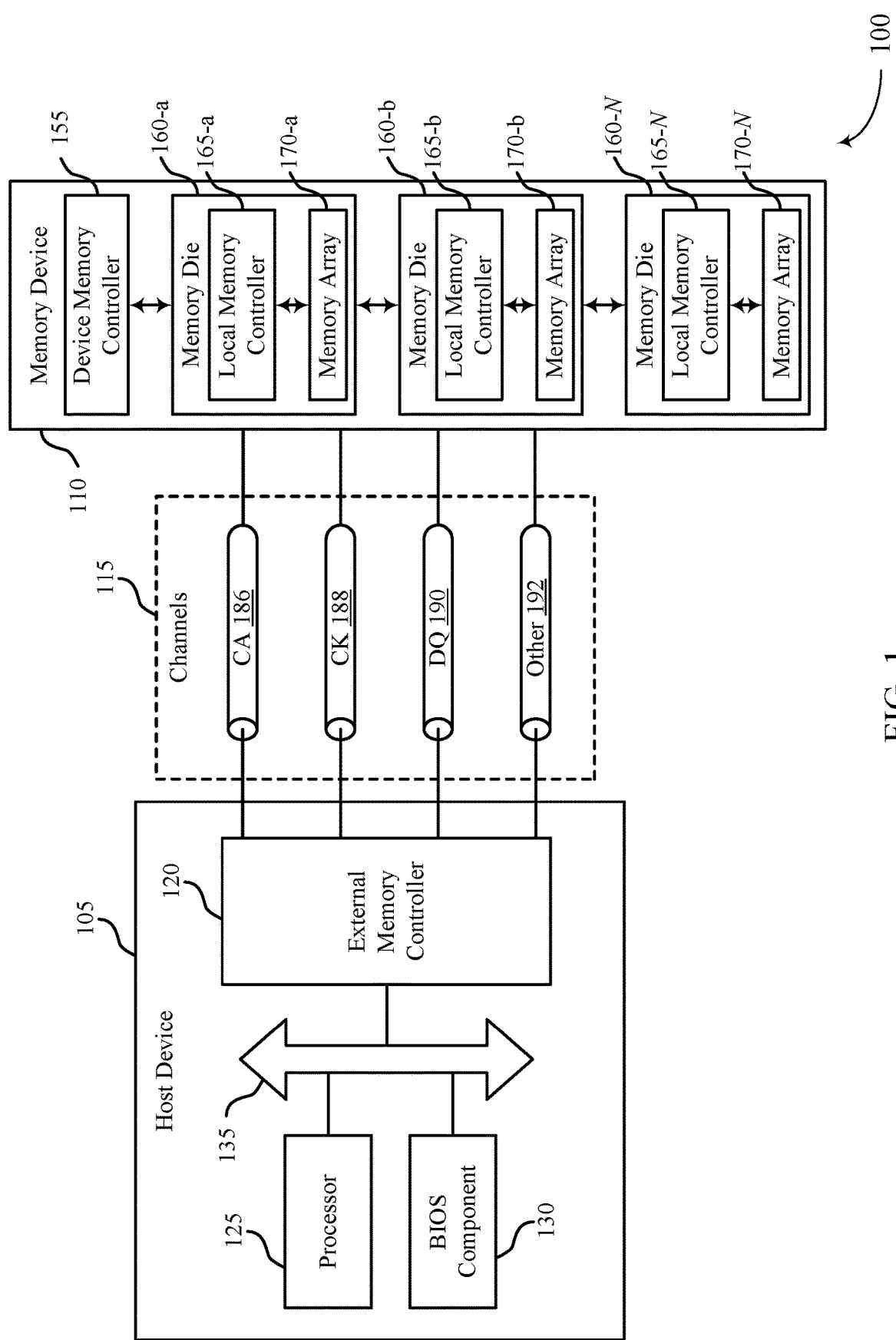
FIG. 1 illustrates an example of a system that supports voltage adjustment of memory dies based on weighted feedback in accordance with examples as disclosed herein.

In some memory systems a power delivery network (PDN) may be used to supply power to components, such as controllers, memory dies (e.g., dynamic random-access memory (DRAM)), and non-volatile memory. The PDN may include a power management integrated circuit (PMIC) to manage the power or voltage supplies to various components. The PMIC may include one or more voltage regulators that provide the supply voltage to the components. The PMIC may adjust the supply voltage based on feedback received from one or more of the components. For example, the supply voltage may be adjusted based on temperatures or voltages measured at the various components. In some systems, the supply voltage may be adjusted based on all of the feedback measurements taken together. But feedback values from different components (or even from different areas of the same component) may have different weights and thereby affect the adjustment of the supply voltage differently. For example, a first area in a circuit may be more responsive to changes to the supply voltage and a second area may be less responsive to changes to the supply voltage. In such examples, the feedback from the first area and the second area may be weighted differently to provide a more refined approach to adjusting the supply voltage. Treating feedback from each area of a circuit the same may be inefficient, resulting in more or less power being supplied than needed.

Systems, devices, and techniques are presented herein for adjusting supply voltages based on weighted feedback signals. This may allow feedback information from areas that are more sensitive to adjustments of the supply voltage and feedback information from areas that are less sensitive to adjustments of the supply voltage to be weighted differently and thereby result in better management of the supply voltage. In particular, systems, devices, and techniques are described in which a voltage of the PDN may be measured at various areas of a memory die, weights may be applied to the measured voltages based on the area or location of the particular measured voltage, and the supply voltage may be adjusted based on the spatially weighted signals. Further, techniques and devices are presented for spatially weighting the signals using both digital and analog techniques and providing a weighted average. In some cases, the weights applied to the signals may be dynamically adjusted. Such cases may allow the weights to be tuned or changed based on changes to the operating conditions of components or areas associated with the respective weight, which may result in better management of the supply voltage.

Features of the disclosure are initially described in the context of systems and dies as described with reference to FIGS. 1 and 2. Features of the disclosure are further described in the context of a block diagram and supporting apparatuses as described with reference to FIGS. 3-5. These and other features of the disclosure are further illustrated by and described with reference to an apparatus diagram and a flowchart that relate to voltage adjustment of memory dies based on weighted feedback as described with reference to FIGS. 6 and 7.

FIG. 1 illustrates an example of a system 100 that supports voltage adjustment of memory dies based on weighted feedback in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general-purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

In some examples, the device memory controller 155 or a local memory controller 165 or both may perform one or more of the operations associated with the example methods discussed herein. For example, the device memory controller 155 or local memory controller 165 may adjust the weighting of a signal by changing a duration of time during which a count may be taken, as discussed herein.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission media that carry information between the host device 105 and the memory device. Each channel 115 may include one or more signal paths or transmission media (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
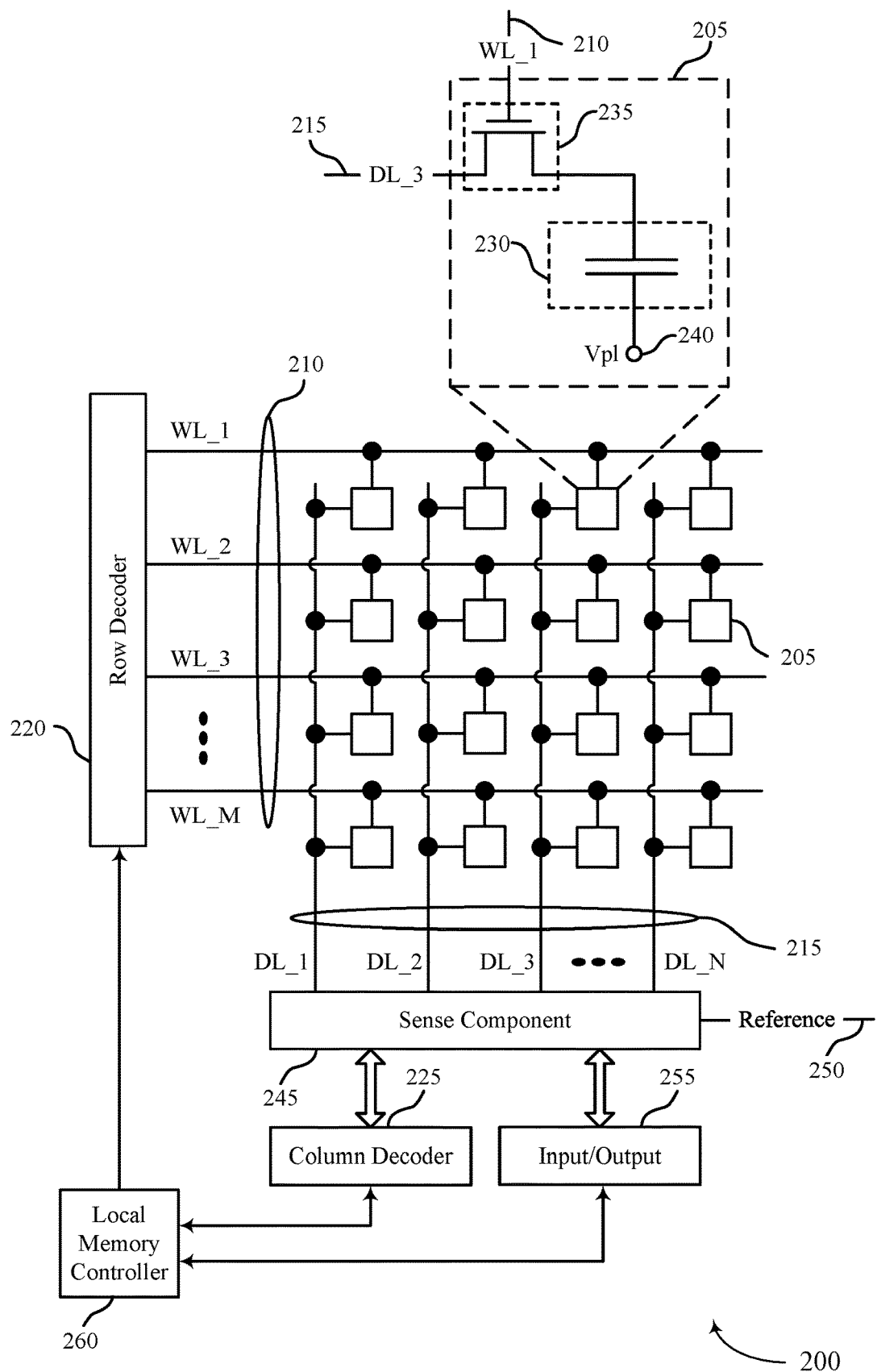
FIG. 2 illustrates an example of a memory die that supports voltage adjustment of memory dies based on weighted feedback in accordance with examples as disclosed herein.

FIG. 2 illustrates an example of a memory die 200 that supports voltage adjustment of memory dies based on weighted feedback in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from a local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200. In some examples, the local memory controller 260 may perform one or more of the operations associated with the example methods discussed herein. For example, the local memory controller 260 may adjust the weighting of a signal by changing a duration of time during which a count may be taken, as discussed herein.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

A supply voltage may be provided to memory dies by a voltage regulator of a PMIC. The voltage regulator may adjust the voltage value based on feedback from various areas of the one or more memory dies. The feedback may be weighted based on the spatial location from which the measurements were taken when determining the adjustments to be made. The weights applied to the feedback signals may be based on the location where the signals were measured. This may be referred to as spatial weighting. Spatial weighting may allow the supply voltage adjustments to be made based on a sensitivity of each location of measured voltages to changes in the supply voltage. This may provide more refined adjustments of the supply voltage, resulting in better management of the supply voltage. In many applications, however, spatial weighting may be fixed because the weighting circuits are made with certain components that may not be adjustable by a controller or other logic.

Figure 3:
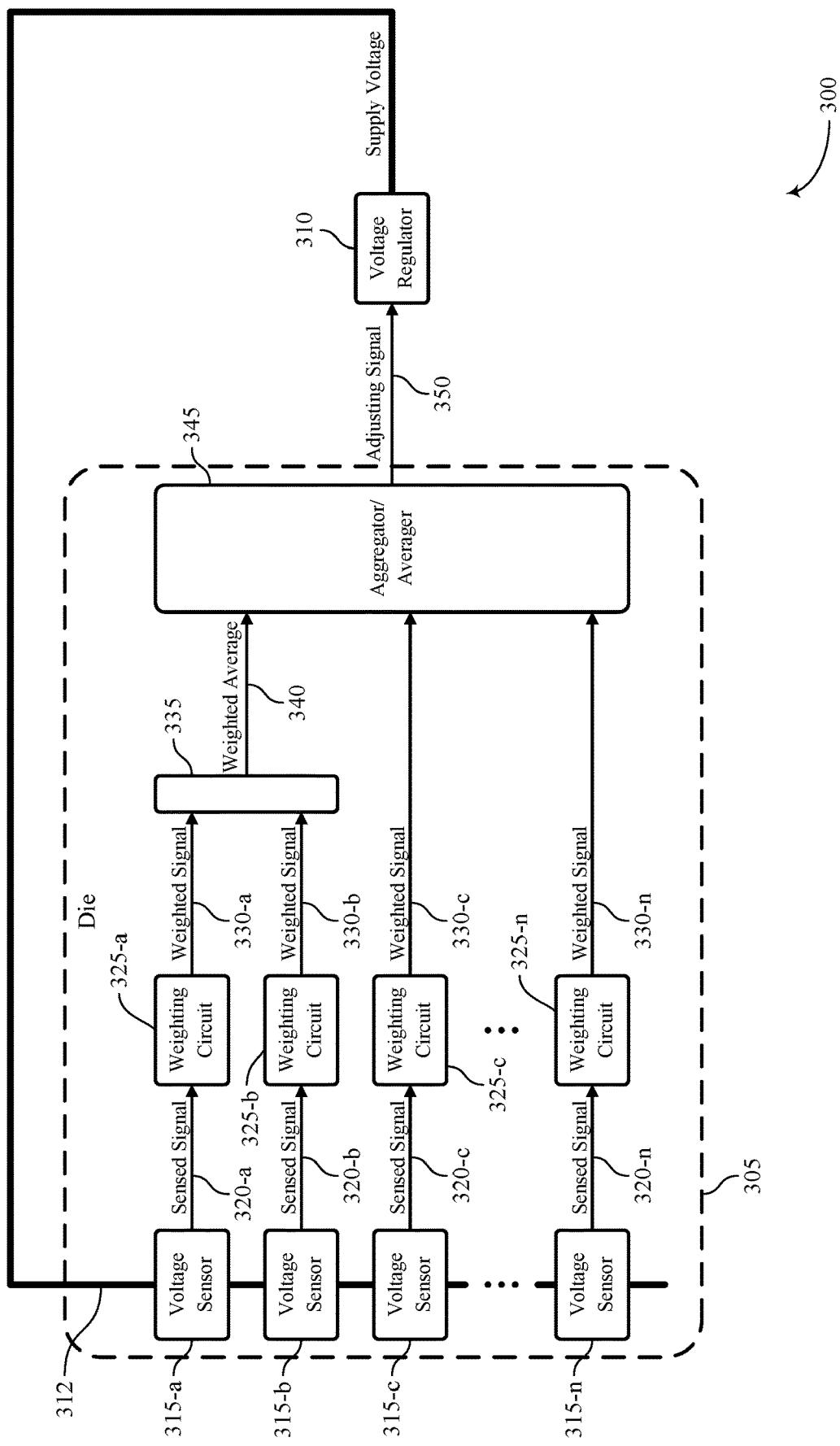
FIG. 3 illustrates an example of a block diagram that supports voltage adjustment of memory dies based on weighted feedback in accordance with examples as disclosed herein.

FIG. 3 illustrates an example of a block diagram 300 that supports voltage adjustment of memory dies based on weighted feedback in accordance with examples as disclosed herein. The block diagram 300 may implement aspects of the system as described with reference to FIGS. 1 and 2. For example, the die 305 may be an example of a die 160, as described with reference to FIG. 1. Using the features depicted in FIG. 3, supply voltages may be automatically adjusted based on weighted feedback signals. For example, a supply voltage may be measured at various areas of a memory die, weights may be applied to the measured voltages based on the import of the particular measured voltage, and the supply voltage may be adjusted based on the weighted signals. Further, weights applied to the signals may be dynamically adjusted to allow for tuning of the weighted signals. These features may result in better management of the supply voltage.

A memory system or memory device (e.g., a RAM module) may include one or more memory dies 305 (e.g., DRAM dies) and one or more voltage regulators 310 (e.g., as part of a PMIC) to supply a voltage to the dies. To simplify the discussion and drawings, a single die 305 and a single voltage regulator 310 are discussed. It is to be understood, however, that the discussion below may be applied to multiple dies and/or multiple voltage regulators.

The die may include different areas thereon. An area of a die may be defined as any location, position, or portion on or in the die. For example, an area of a die may refer to any single position on the die, such as a position where a voltage can be measured. As another example, an area of a die may refer to a region of the die and the die may be separated into any quantity of regions (e.g., 2, 4, 8, 16 regions).

A plurality of voltage sensors 315 (e.g., voltage sensors 315-a, 315-b, 315-c, and 315-n) may be positioned at different areas of a die 305. Each voltage sensor 315 may be configured to sense a voltage level of a supply line 312 (or a plurality of different supply lines, as the case may be) at the respective area and output a respective signal 320 (e.g., signals 320-a, 320-b, 320-c, and 320-n). The signal 320 output by each voltage sensor 315 may be an indication of the voltage sensed by the voltage sensor 315 at the particular location. Although the block diagram 300 illustrates four voltage sensors 315-a, 315-b, 315-c, and 315-n, the memory system may include any quantity of voltage sensors 315 positioned at different areas of the die 305.

A plurality of weighting circuits 325 (e.g., weighting circuits 325-a, 325-b, 325-c, and 325-n) may receive the signals 320 from the voltage sensors 315 and output weighted signals 330 (e.g., weighted signals 330-a, 330-b, 330-c, and 330-n). Each weighting circuit 325 may receive a respective signal 320 from a respective voltage sensor 315. For example, weighting circuit 325-a may receive signal 320-a from voltage sensor 315-a, weighting circuit 325-b may receive signal 320-b from voltage sensor 315-b, weighting circuit 325-c may receive signal 320-a from voltage sensor 315-c, and weighting circuit 325-n may receive signal 320-a from voltage sensor 315-n. Thus, although the block diagram 300 illustrates four weighting circuits 325-a, 325-b, 325-c, and 325-n, the memory system may include any quantity of weighting circuits 325, equal to the quantity of voltage sensors 315.

A weight may be assigned to each sensed signal 320 based on the relative importance of the area associated with the sensed signal (e.g., where the corresponding voltage sensor was located). For example, if an area of the memory die is less sensitive to changes of the supply voltage than a second area of the die, a weight applied to the signal sensed at the first area may be greater than a weight applied to the signal sensed at the second area (or vice versa). Weighting the signals in this way may allow feedback signals from some areas to affect adjustments of the supply voltage more than feedback signals from other areas, resulting in better management of the supply voltage.

The weight associated with each signal may be based at least in part on the respective area of the memory die associated with the signal. For example, the weight may be based on the general location of the associated voltage sensor 315 within the die (e.g., outside edge vs. in the middle), the sensitivity of the circuit at the particular area, etc. Weighting of the signal may be performed in any way desired.

In some cases, an averaging circuit 335 may receive two or more of the weighted signals 330 from respective weighting circuits 325 and output a weighted average 340. For example, in the example illustrated in FIG. 3, an averaging circuit 335 may receive weighted signals 330-a and 330-b from weighting circuits 325-a and 325-b and output a weighted average 340. The weighted average 340 may be a weighted average of the signals 320 associated with the respective weighting circuits 325. In some cases, the weighted average 340 may be an average of the weighted signals 330 received by the averaging circuit 335. Although the block diagram 300 illustrates a single averaging circuit 335 receiving two weighted signals 330-a and 330-b, the memory system may include any quantity of averaging circuits 335, each receiving any quantity of weighted signals 330, up to all of the weighted signals 330 of the memory system.

In some examples, the weighting circuit 325 may include digital weighting. For example, the weighting circuit 325 may include an oscillator circuit that may determine a quantity (e.g., a count) of oscillations produced by an oscillator (e.g., a ring oscillator) in a duration of time, based on the respective signal 320. The count may be based on the frequency of oscillation of the oscillator and the duration of time that the oscillations are counted. The frequency of oscillation may generally be based on the signal 320. The weighting of the signal may be based on the duration of time that the oscillations output by the oscillator are counted. A longer duration may result in a higher quantity (e.g., a larger weight) of oscillations counted for a signal 320 and a shorter duration may result in a lower quantity (e.g., a smaller weight) of oscillations counted for the same signal. In some cases, the duration of time associated with an oscillator may be changed to adjust the weighting of the respective signal. This may be done dynamically, if desired, by a controller (e.g., by a local memory controller 165 or device memory controller 155). In some cases, the weighted count may represent the weighted signal 330. In some cases, the weighted count may be converted to an analog signal (e.g., by a digital-to-analog converter (DAC)) before being output from the oscillator circuit as the weighted signal 330.

In some cases, the averaging circuit 335 may receive the weighted counts from each oscillator circuit and determine a weighted average count based thereon. The averaging circuit may do this by determining a total quantity of the weighted counts and dividing the total quantity by a sum of the weightings. In some cases, the weighted count may represent the weighted average 340. In some cases, the weighted average count may be converted to an analog signal (e.g., by a DAC) before being output from the averaging circuit 335 as the weighted average 340.

In some examples, the weighting circuit 325 may include analog weighting. For example, the weighting circuit 325 may include a capacitive circuit applied to the respective signal. The capacitive circuit may include one or more capacitive components (e.g., capacitors) that get charged during the sensing phase. The weighting may be based on the capacitance of the capacitive circuit. In some cases, a higher capacitance may equate to a greater weight when the signals are combined in an averaging circuit. For example, the averaging circuit 335 may include a switch configured to combine the outputs (e.g., short the outputs together) of the respective capacitive circuits in parallel to produce the weighted average 340. The signals having higher capacitances may discharge relatively more charge and may therefore affect the combined signal more than signals having lower capacitance. In some cases, the capacitance of a capacitive circuit may be changed to adjust the weighting of the respective signal. In some cases, multiple capacitors may be formed on the die and attached to the capacitive circuit, as desired.

An aggregator 345 may receive the weighted signals 330 and weighted averages 340 from the weighting circuits 325 and averaging circuits 335 and output an adjusting signal 350 based thereon. The weighted signals and weighted averages may be associated with a single die, as illustrated, or multiple dies. In some cases, the aggregator 345 may first determine a desired voltage value for the supply voltage based on the weighted signals and weighted averages. The aggregator may then determine a value for the adjusting signal 350, based thereon, to provide to the voltage regulator 310. In some cases, the aggregator 345 may determine the value for the adjusting signal 350 without first determining the desired voltage value. In some cases, the adjusting signal may represent a desired voltage for the voltage regulator to supply. In some cases, the adjusting signal may represent a desired change to be made to the supply voltage. In some cases, the aggregator 345 may perform a similar function as the averaging circuit 335 to determine the adjusting signal value. In those cases, the averaging circuits may not be used. In some cases, one or more averaging circuits 335 may be folded into the aggregator 345.

The block diagram 300 illustrates all of the components discussed above (the voltage sensors 315, the weighting circuits 325, the averaging circuit 335 and the aggregator 345) as being positioned on the die 305. But this is just one example. In other examples, the weighting circuits 325, the averaging circuit and/or the aggregator 345 may be positioned on other parts of the memory system, such as, e.g., a memory system on which the die may be positioned.

The voltage regulator 310 may be part of a PMIC that may be, itself, part of a power delivery network (PDN) for a memory system. The voltage regulator 310 may be configured to provide local voltage regulation on a memory system and may provide a supply voltage to one or more dies of the memory system. The voltage regulator 310 may adjust the voltage level of the supply voltage based on the adjusting signal 350 provided by the aggregator 345. For example, if the adjusting signal indicates a droop in the voltage, the voltage regulator may raise the voltage level, and if the adjusting signal indicates a high voltage, the voltage regulator may lower the voltage level. Because the adjusting signal may be based on weighted feedback from various areas of one or more dies, the adjusted voltage level may be a more accurate representation of the amount needed by the one or more dies. This may result in better management of the supply voltage.

Figure 4A:
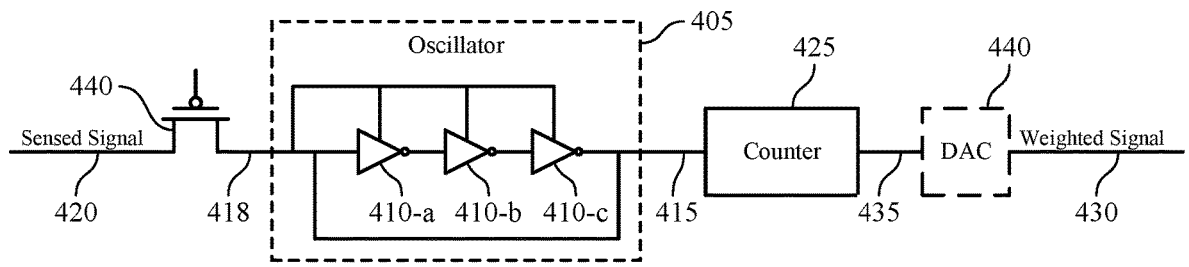
FIGS. 4A and 4B illustrate examples of an oscillator circuit and an averaging circuit that support voltage adjustment of memory dies based on weighted feedback in accordance with examples as disclosed herein.
Figure 4B:
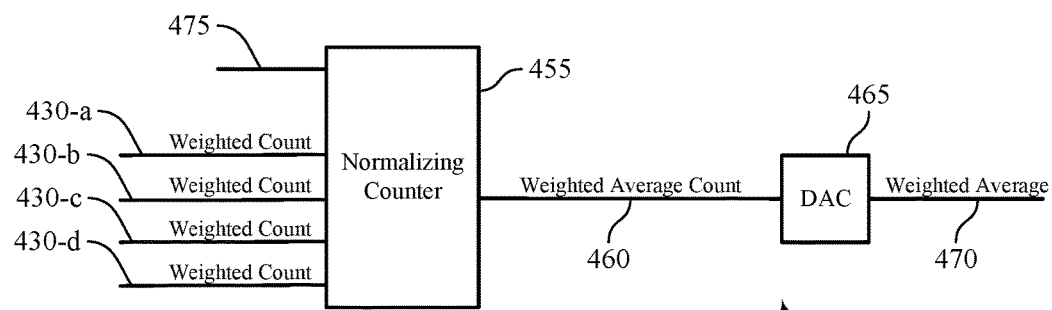

FIGS. 4A and 4B illustrate examples of an oscillator circuit 400 and an averaging circuit 450 that support voltage adjustment of memory dies based on weighted feedback in accordance with examples as disclosed herein. The oscillator circuit 400 may be an example of a weighting circuit 325 described with reference to FIG. 3. The averaging circuit 450 may be an example of an averaging circuit 335 discussed with reference to FIG. 3. Using the features depicted in FIGS. 4A and 4B, a weight may be digitally applied to a sensed signal 420 (e.g., from a voltage sensor) and a digital or analog weighted signal 430 may be output, based thereon. Further, because the weight may be digitally applied, the weight may be dynamically adjusted (e.g., by a controller) to tune the weighted signal. Further a weighted average 470 may be generated based on a plurality of weighted signals 430. These may all result in better management of the supply voltage.

The oscillator circuit 400 may receive a sensed signal 420 (e.g., a signal 320 discussed with reference to FIG. 3) e.g., from a voltage sensor and may determine a quantity (e.g., a count) of oscillations produced by an oscillator (e.g., a ring oscillator) over a particular duration of time, based on the received signal 420. The count may be based on the frequency of oscillation of the oscillator and the duration of time that the oscillations are counted.

The oscillator circuit 400 may include an oscillator 405 that receives the sensed signal 420 and outputs an oscillating signal 415 based thereon. In some cases, the oscillator 405 may include an odd quantity of inverting stages (e.g., inverters 410-a, 410-b, and 410-c) connected in series, with the output fed back to the input 418 to form a ring oscillator. Although three inverters 410-a, 410-b, and 410-c may make up the inverting stages of the ring oscillator 405 illustrated in FIG. 4, any odd quantity of inverting stages may be used.

In a ring oscillator, the oscillator period may be equal to twice the sum of the individual delays of all of the inverting stages. So if t represents the time delay for a single inverter 410 and n represents the quantity of inverters 410 in the inverter chain, then the frequency of oscillation may be given by: $f=1/(2tn)$. Changing the value of the input (e.g., the sensed signal 420) to the ring oscillator 405 may change the delay t through each inverter 410, with higher voltages typically decreasing the delay and thus increasing the oscillator frequency. Thus, the frequency of oscillation of the oscillating signal 415 may be based at least in part on the value of the sensed signal 420. In particular, a higher oscillator frequency may represent a higher voltage relative to a lower oscillator frequency.

A counter 425 may receive the oscillating signal 415 of the ring oscillator 405 and output a count 435 of the quantity of oscillations. The count may be obtained for a particular duration of time (e.g., 100 nsec or 1 μsec). A switch may be turned on for the duration of time to accomplish this.

In some cases, a switch 440 may couple and uncouple the oscillator input 418 with the sensed signal 420. When the switch 440 is actuated, the oscillator 405 may be coupled with the sensed signal and oscillate based thereon. When the switch 440 is not actuated, the oscillator may become uncoupled from the signal 420 and cease oscillating. Thus, the counter 425 may count the quantity of oscillations made during the time period that the switch 440 is actuated. In other cases (not shown), the switch 440 may be positioned between the oscillator 405 and the counter 425 to couple and uncouple the counter input with the oscillator output. In those cases, the oscillator 405 may oscillate continuously, but the counter 425 may be coupled with the oscillating signal 415 of the oscillator 405 when the switch 440 is actuated, thus counting the quantity of oscillations during the time period that the switch 440 is actuated.

In such examples, the count may be based on the frequency of oscillation of the oscillator and the duration of time that the oscillations are counted. The frequency of oscillation may generally be based on the signal 420. But the relative frequency of oscillation may be adjusted with little or no effect on the relative frequencies dependence on the signal 420. For example, adjusting the quantity of inverting stages (e.g., inverters 410) that may make up the ring oscillator 405 may cause the overall frequency of oscillation to change while still allowing the frequency to be dependent on the input signal 420. Because the frequency of oscillation may be given by $f=1/(2tn)$, adding or removing inverters to the ring oscillator may increase or decrease n, resulting in a lower or higher frequency of oscillation, respectively. This may result in an adjusted overall count output by the counter 425 with little or no effect on the relative count. But while this may change the overall frequency, adding or removing invertors to the circuit may be difficult to do, especially after production. Further, it may involve more real estate on the memory system.

One way to weight the signal while reflecting the relative value of the signal may be to base the weight on the duration of time the oscillations are counted; a longer duration may result in a higher quantity (e.g., a larger weight) of oscillations for a signal 420 and a shorter duration may result in a lower quantity (e.g., a smaller weight) of oscillations for the same signal. In some cases, the switch 440 may be used to adjust the duration of time. The duration the switch 440 is actuated may cause the oscillator 405 to be coupled with the sensed signal for less time or the counter 425 to be coupled with the oscillator for less time. Either way, the overall count may be affected by this with little or no effect on the relative count.

The duration of actuation for the switch 440 may be controlled by a controller (e.g., a device memory controller 155 or a local memory controller 165) for the oscillator circuit 400. For example, the controller may oversee when the switch 440 is actuated. As such, the duration associated with each oscillator circuit 400 may be programmed into the controller when the memory device is manufactured. A change to the duration of time a switch is actuated may be effected by a controller (e.g., a device memory controller 155 or a local memory controller 165). In some cases, the duration of time associated with an oscillator circuit 400 may be changed (e.g., after manufacture) to adjust the weighting of the respective signal. This may be done dynamically, if desired, using the controller. This may be desired, e.g., if an area of the die changes import, e.g., due to memory banks not working anymore.

In some cases, the count 435 output from the counter 425 may be output from the oscillator circuit 400 as the weighted signal 430. For example, the count may be output as the weighted signal 430 to be input to a counting-type of averaging circuit, such as the averaging circuit 450 illustrated in FIG. 4B. In some cases, the weighted count may be converted to an analog signal by a digital-to-analog converter (DAC) before being output from the oscillator circuit as the weighted signal 430.

Basing the weight on the duration of time the oscillations are counted provides many advantages. For example, by using controllers to control the switches and by storing the durations in a controller, changes in import of different areas of a die (e.g., due to iterations of a design) may be updated by programming them into the controller. Further, the duration of time associated with any oscillator circuit may be dynamically changed to adjust the weighting of the respective signal using the controller. This may allow the weights to be tuned or changed based on changes to the import of the component or area of the component associated with the respective weight, resulting in better management of the supply voltage.

Turning to FIG. 4B, the averaging circuit 450 may include a normalizing counter 455 that receives as inputs, weighted signals 430 (e.g., weighted signals 430-a, 430-b, 430-c, and 430-d) comprising weighted counts output by respective oscillator circuits 400 and outputs a weighted average count 460. The counter 455 may also receive as an input, a sum of the weights 475 associated with the weighted signals 430. Alternatively, the counter 455 may receive indications of each weight of the respective oscillator circuits 400 and may sum the weighted counts thereof. The weighted average count 460 may be converted to an analog signal (e.g., by a DAC 465) before being output from the averaging circuit 450 as a weighted average 470.

Although FIG. 4B illustrates the counter 455 receiving four weighted signals 430-a, 430-b, 430-c, and 430-d from respective oscillator circuits 400, the counter 455 may receive any quantity of weighted signals 430. In some examples, the counter 455 may aggregate the counts of all of the weighted signals 430 and normalize the aggregate based on the sum of the weights 475 (e.g., by dividing the aggregate by the sum of the weights). Because the weighted counts may be higher or lower based on their weights, counts having higher weights may affect the weighted average more than counts having lower weights.

For example, if two sensed signals (e.g., sensed signals 420) indicate voltage levels of 0.5 volts and 1.0 volt at first and second areas of a die, and each unweighted count is equivalent to 0.1 volt, the unweighted counts associated with the first and second areas may be, e.g., 5 and 10. If the second area has a weight that is twice that of the first area (e.g., a weight of 2 vs. a weight of 1), the weighted signals 430 (e.g., applying the weights to the counts) for the first and second areas might be, e.g., 5 and 20, respectively. The counter 455 may aggregate the weighted counts and divide by the sum of the weights to output a weighted average count 460 of 8.3 (e.g., (5+20)/(1+2)). Because each count may be equivalent to 0.1 volts, the DAC 465 may convert the weighted average count to 0.83 volts, which may be output as the weighted average 470. As is easily determined, 0.83 volts may be closer to the voltage sensed at the second area (1.0 volts) than the voltage sensed at the first area (0.5 volts). Thus, the second area, which has a higher weight, may have effected the weighted average more than the first area.

Using a normalizing counter is a straightforward way to determine the weighted average count. And because the counts are digital representations, the inputs to the normalizing counter (or even the counter itself) may be controlled or performed by a controller (e.g., a device memory controller 155 or a local memory controller 165).

Figure 5:
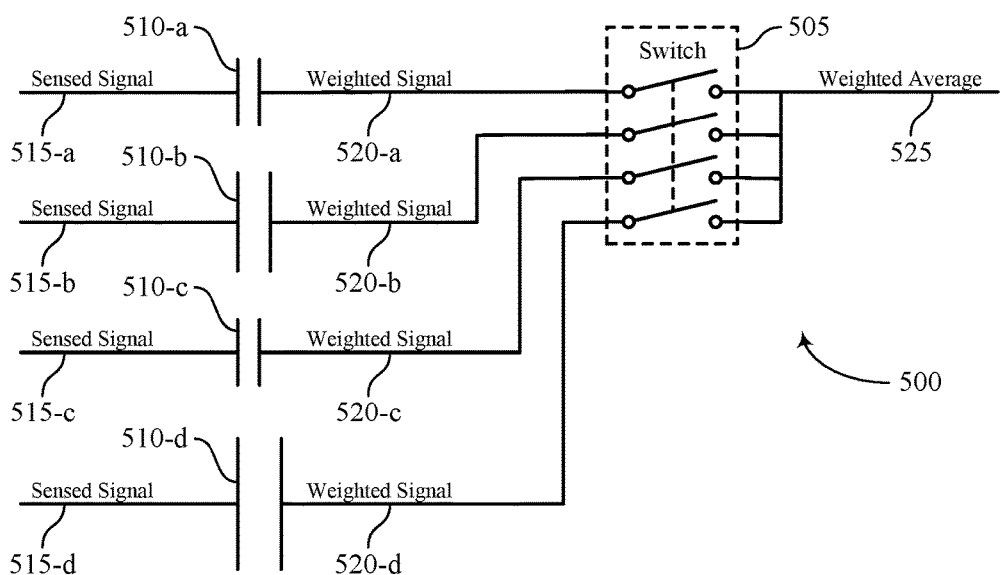
FIG. 5 illustrates examples of a switch circuit and a plurality of capacitive circuits coupled therewith that support voltage adjustment of memory dies based on weighted feedback in accordance with examples as disclosed herein.

FIG. 5 illustrates an example of a switch circuit 500 and a plurality of capacitive circuits 510 coupled therewith that support voltage adjustment of memory dies based on weighted feedback in accordance with examples as disclosed herein. The switch circuit 500 may be an example of an averaging circuit 335 discussed with reference to FIG. 3. The capacitive circuits 510 may be examples of weighting circuits 325 discussed with reference to FIG. 3. Using the features depicted in FIG. 5, weights in the form of capacitances may be applied to sensed signals (e.g., from voltage sensors) based on the import of each signal and an analog weighted average may be output, based on the weighted signals. This may result in better management of the supply voltage.

A plurality of capacitive circuits 510 (e.g., capacitive circuits 510-a, 510-b, 510-c, 510-d) may each receive a respective sensed signal 515 (e.g., sensed signals 515-a, 515-b 515-c, and 515-d) (e.g., signals 320 discussed with reference to FIG. 3) and output a respective weighted signal 520 (e.g., weighted signals 520-a, 520-b, 520-c, and 520-d) (e.g., signals 330 discussed with reference to FIG. 3), based thereon. For example, capacitive circuit 510-a may receive sensed signal 515-a and output weighted signal 520-a, capacitive circuit 510-b may receive sensed signal 515-b and output weighted signal 520-b, capacitive circuit 510-c may receive sensed signal 515-c and output weighted signal 520-c, and capacitive circuit 510-d may receive sensed signal 515-d and output weighted signal 520-d.

The capacitive circuit 510 may include one or more capacitive components (e.g., capacitors). In the example of FIG. 5, each capacitive circuit 510 is depicted as a capacitor, though other types of capacitive circuits are also possible. During a sensing phase, the output sides of the capacitive circuits 510 may be open so that the capacitive circuits 510 may be charged by the respective sensed signals 515.

The weighting of each signal may be based on the capacitance of the respective capacitive circuit 510. In some cases, a higher capacitance may equate to a greater weight when the signals are combined in an averaging circuit. For example, the switch circuit 500 may include a switch 505 configured to combine the weighted signals 520 (e.g., short the signals together) of the respective capacitive circuits in parallel to produce the weighted average 525.

Upon actuation of the switch 505, the output sides of the capacitive circuits 510 may be shorted so that the capacitive circuits 510 may be connected in parallel. When this happens, the capacitive circuits 510 may be discharged. The capacitive circuits 510 having higher capacitances may discharge relatively more charge. So the portion of each sensed signal 515 that comprises the combined signal (e.g., the weighted average 525) may be proportional to the capacitance associated with each signal (e.g., signal 515). As a result, a signal 515 having a higher capacitance applied thereto may have a greater impact on the weighted average. Therefore, the weight of each signal 515 may be based on the capacitance of the capacitive circuit 510 associated with the signal 515.

Although FIG. 5 illustrates switch 505 as a four pole, single throw switch with four inputs and four outputs, the switch 505 may be any multipole, single throw switch that receives outputs from any quantity of respective capacitive circuits 510.

To adjust the weight applied to a sensed signal 515, the capacitance associated with that the signal may be changed. In some cases, extra capacitors may be formed on the die and attached to a signal, as desired, to change the capacitance associated with the signal. Capacitances may be an effective way to weight the signals. But capacitances of lines may vary due to loads and other influences on the line. Further, it may be difficult to change the capacitance of the line after the memory system has been manufactured. Extra capacitors may be formed on the die for doing so, but that may involve more real estate on the memory system. Further, adding or removing the capacitors to a line may be difficult.

Figure 6:
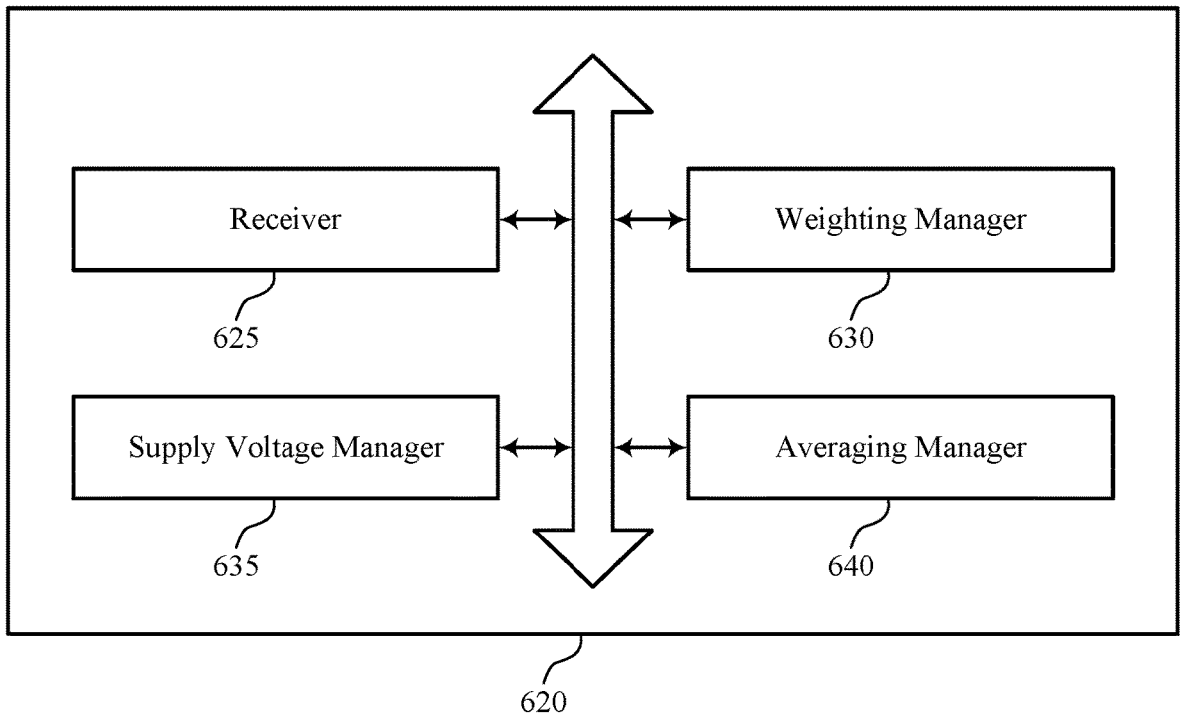
FIG. 6 illustrates a block diagram of a memory device that supports voltage adjustment of memory dies based on weighted feedback in accordance with examples as disclosed herein.

FIG. 6 illustrates a block diagram 600 of a memory device 620 that supports voltage adjustment of memory dies based on weighted feedback in accordance with examples as disclosed herein. The memory device 620 may be an example of aspects of a memory device as described with reference to FIGS. 1 through 5. The memory device 620, or various components thereof, may be an example of means for performing various aspects of voltage adjustment of memory dies based on weighted feedback as described herein. For example, the memory device 620 may include a receiver 625, a weighting manager 630, a supply voltage manager 635, an averaging manager 640, or any combination thereof. Each of these components may communicate, directly or indirectly, with one another (e.g., via one or more buses).

The receiver 625 may be configured as or otherwise support a means for receiving a plurality of signals each indicating a voltage at a respective area of a memory die. The weighting manager 630 may be configured as or otherwise support a means for weighting each signal of the plurality of signals to generate a plurality of weighted signals, the weighting of each signal based at least in part on the respective area of the memory die associated with the signal. The supply voltage manager 635 may be configured as or otherwise support a means for adjusting a voltage level of a supply voltage based at least in part on the plurality of weighted signals.

In some examples, the averaging manager 640 may be configured as or otherwise support a means for averaging the plurality of weighted signals to generate a weighted average of the plurality of signals, where adjusting the voltage level of the supply voltage is based at least in part on the weighted average of the plurality of signals.

In some examples, to support weighting each signal of the plurality of signals to generate the plurality of weighted signals, the weighting manager 630 may be configured as or otherwise support a means for applying each signal of the plurality of signals to a respective oscillator of a plurality of oscillators. In some examples, to support weighting each signal of the plurality of signals to generate the plurality of weighted signals, the weighting manager 630 may be configured as or otherwise support a means for counting, for a respective duration, a quantity of oscillations output by each oscillator in response to applying the plurality of signals to the plurality of oscillators.

In some examples, the averaging manager 640 may be configured as or otherwise support a means for averaging the quantity of oscillations output by each oscillator of the plurality of oscillators to produce an average count, where adjusting the voltage level of the supply voltage is based at least in part on the average count.

In some examples, the averaging manager 640 may be configured as or otherwise support a means for converting the average count into an analog signal, where adjusting the voltage level of the supply voltage is based at least in part on the analog signal.

In some examples, the weighting manager 630 may be configured as or otherwise support a means for adjusting a weight applied to a signal of the plurality of signals by adjusting a frequency of oscillation associated with an oscillator of the plurality of oscillators.

In some examples, the weighting manager 630 may be configured as or otherwise support a means for adjusting a weight applied to a signal of the plurality of signals by adjusting the respective duration that the quantity of oscillations output by an oscillator of the plurality of oscillators is counted.

In some examples, an oscillator of the plurality of oscillators may include a ring oscillator.

In some examples, to support weighting each signal of the plurality of signals to generate the plurality of weighted signals, the weighting manager 630 may be configured as or otherwise support a means for applying a respective capacitance to each signal.

In some examples, the averaging manager 640 may be configured as or otherwise support a means for combining the plurality of weighted signals together to produce a weighted average of the plurality of signals, where adjusting the voltage level of the supply voltage is based at least in part on the weighted average.

In some examples, the weighting manager 630 may be configured as or otherwise support a means for adjusting a weight associated with a signal of the plurality of signals by adjusting the capacitance associated with the signal.

In some examples, the receiver 625 may be configured as or otherwise support a means for receiving a second signal indicative of a voltage of a second memory die, where adjusting the voltage level of the supply voltage is based at least in part on the second signal.

In some examples, to support adjusting the voltage level of the supply voltage, the supply voltage manager 635 may be configured as or otherwise support a means for sending an adjusting signal to a voltage regulator.

Figure 7:
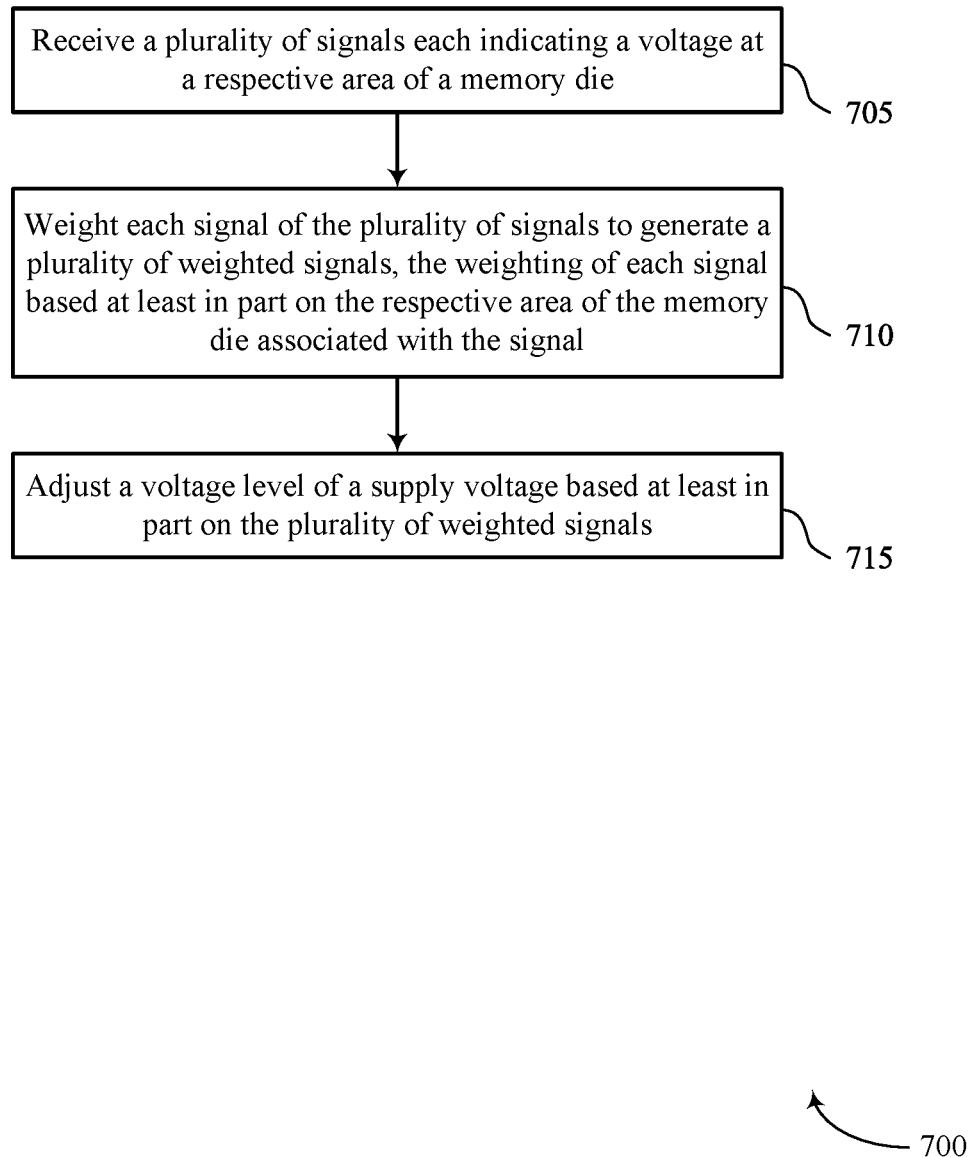
FIG. 7 illustrates a flowchart illustrating a method that supports voltage adjustment of memory dies based on weighted feedback in accordance with examples as disclosed herein.

FIG. 7 illustrates a flowchart illustrating a method 700 that supports voltage adjustment of memory dies based on weighted feedback in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 705, the method may include receiving a plurality of signals each indicating a voltage at a respective area of a memory die. The operations of 705 may be performed in accordance with examples as disclosed herein. In some examples, aspects of the operations of 705 may be performed by a receiver 625 as described with reference to FIG. 6.

At 710, the method may include weighting each signal of the plurality of signals to generate a plurality of weighted signals, the weighting of each signal based at least in part on the respective area of the memory die associated with the signal. The operations of 710 may be performed in accordance with examples as disclosed herein. In some examples, aspects of the operations of 710 may be performed by a weighting manager 630 as described with reference to FIG. 6.

At 715, the method may include adjusting a voltage level of a supply voltage based at least in part on the plurality of weighted signals. The operations of 715 may be performed in accordance with examples as disclosed herein. In some examples, aspects of the operations of 715 may be performed by a supply voltage manager 635 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving a plurality of signals each indicating a voltage at a respective area of a memory die, weighting each signal of the plurality of signals to generate a plurality of weighted signals, the weighting of each signal based at least in part on the respective area of the memory die associated with the signal, and adjusting a voltage level of a supply voltage based at least in part on the plurality of weighted signals.

Some examples of the method 700 and the apparatus described herein may further include operations, features, circuitry, logic, means, or instructions for averaging the plurality of weighted signals to generate a weighted average of the plurality of signals, where adjusting the voltage level of the supply voltage may be based at least in part on the weighted average of the plurality of signals.

In some examples of the method 700 and the apparatus described herein, weighting each signal of the plurality of signals to generate the plurality of weighted signals may include operations, features, circuitry, logic, means, or instructions for applying each signal of the plurality of signals to a respective oscillator of a plurality of oscillators and counting, for a respective duration, a quantity of oscillations output by each oscillator in response to applying the plurality of signals to the plurality of oscillators.

Some examples of the method 700 and the apparatus described herein may further include operations, features, circuitry, logic, means, or instructions for averaging the quantity of oscillations output by each oscillator of the plurality of oscillators to produce an average count, where adjusting the voltage level of the supply voltage may be based at least in part on the average count.

Some examples of the method 700 and the apparatus described herein may further include operations, features, circuitry, logic, means, or instructions for converting the average count into an analog signal, where adjusting the voltage level of the supply voltage may be based at least in part on the analog signal.

Some examples of the method 700 and the apparatus described herein may further include operations, features, circuitry, logic, means, or instructions for adjusting a weight applied to a signal of the plurality of signals by adjusting a frequency of oscillation associated with an oscillator of the plurality of oscillators.

Some examples of the method 700 and the apparatus described herein may further include operations, features, circuitry, logic, means, or instructions for adjusting a weight applied to a signal of the plurality of signals by adjusting the respective duration that the quantity of oscillations output by an oscillator of the plurality of oscillators may be counted.

In some examples of the method 700 and the apparatus described herein, an oscillator of the plurality of oscillators may include a ring oscillator.

In some examples of the method 700 and the apparatus described herein, weighting each signal of the plurality of signals to generate the plurality of weighted signals may include operations, features, circuitry, logic, means, or instructions for applying a respective capacitance to each signal.

Some examples of the method 700 and the apparatus described herein may further include operations, features, circuitry, logic, means, or instructions for combining the plurality of weighted signals together to produce a weighted average of the plurality of signals, where adjusting the voltage level of the supply voltage may be based at least in part on the weighted average.

Some examples of the method 700 and the apparatus described herein may further include operations, features, circuitry, logic, means, or instructions for adjusting a weight associated with a signal of the plurality of signals by adjusting the capacitance associated with the signal.

Some examples of the method 700 and the apparatus described herein may further include operations, features, circuitry, logic, means, or instructions for receiving a second signal indicative of a voltage of a second memory die, where adjusting the voltage level of the supply voltage may be based at least in part on the second signal.

In some examples of the method 700 and the apparatus described herein, adjusting the voltage level of the supply voltage may include operations, features, circuitry, logic, means, or instructions for sending an adjusting signal to a voltage regulator.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a memory die, a plurality of voltage sensors positioned at different areas of the memory die and configured to output a plurality of signals, each voltage sensor of the plurality of voltage sensors configured to output a respective signal of the plurality of signals indicating a voltage sensed at a respective area of the memory die, a first circuit coupled with the plurality of voltage sensors and configured to receive the plurality of signals from the plurality of voltage sensors and weight each signal of the plurality of signals to generate a plurality of weighted signals, the weighting of each signal based at least in part on the respective area of the memory die associated with the signal, and a voltage regulator coupled with the first circuit and configured to provide a supply voltage to the memory die and adjust a voltage level of the supply voltage based at least in part on the plurality of weighted signals.

In some examples, the apparatus may include a second circuit coupled with the first circuit and the voltage regulator and configured to average the plurality of weighted signals to generate a weighted average of the plurality of signals, where the voltage regulator may be configured to adjust the voltage level of the supply voltage based at least in part on the weighted average of the plurality of signals.

In some examples of the apparatus, the first circuit may include a plurality of oscillators, each configured to receive a respective signal of the plurality of signals and weight the respective signal by outputting a quantity of oscillations for a respective duration.

In some examples, the apparatus may include a second circuit coupled with the plurality of oscillators and the voltage regulator and configured to produce an average count by averaging the quantity of oscillations output by each oscillator of the plurality of oscillators, where the voltage regulator may be configured to adjust the voltage level of the supply voltage based at least in part on the average count.

In some examples, the apparatus may include a digital-to-analog converter coupled with the second circuit and the voltage regulator and configured to convert the average count into an analog signal, where the voltage regulator may be configured to adjust the voltage level of the supply voltage based at least in part on the analog signal.

In some examples of the apparatus, the weighting of each signal of the plurality of signals may be based at least in part on a frequency of oscillation associated with the oscillator configured to receive the respective signal.

In some examples of the apparatus, the weighting of each signal may be based at least in part on the respective duration that the quantity of oscillations output by the oscillator may be counted.

In some examples of the apparatus, the plurality of oscillators may include a plurality of ring oscillators.

In some examples of the apparatus, the first circuit may include a plurality of capacitive circuits, each configured to receive a respective signal of the plurality of signals, where the weighting of each signal may be based at least in part on a capacitance of the respective capacitive circuit.

In some examples, the apparatus may include a second circuit coupled with the plurality of capacitive circuits and the voltage regulator and configured to combine the plurality of weighted signals together to produce a weighted average of the plurality of signals, where the voltage regulator may be configured to adjust the voltage level of the supply voltage based at least in part on the weighted average.

In some examples, the apparatus may include a second memory die and a second voltage sensor positioned on the second memory die and coupled with the voltage regulator and configured to output a second signal indicating a second voltage sensed at the second memory die, where the voltage regulator may be configured to adjust the voltage level of the supply voltage based at least in part on the second signal.

Another apparatus is described. The apparatus may include a memory die, a power circuit coupled with the memory die and configured to provide one or more voltages to the memory die, and a controller coupled with the memory die and the power circuit, the controller configured to cause the power circuit to receive a plurality of signals from a plurality of voltage sensors coupled with the memory die, each signal of the plurality of signals indicating a voltage at an area of the memory die, weight each signal of the plurality of signals to generate a plurality of weighted signals based at least in part on the area of the memory die, and adjust a voltage level of a supply voltage used by the memory die based at least in part on the plurality of weighted signals.

In some examples of the apparatus, the controller may be configured to cause the power circuit to average the plurality of weighted signals to generate a weighted average of the plurality of signals, wherein adjusting the voltage level of the supply voltage is based at least in part on the weighted average of the plurality of signals.

In some examples of the apparatus, the controller may be configured to cause the power circuit to apply each signal of the plurality of signals to a respective oscillator of a plurality of oscillators and count, for a respective duration, a quantity of oscillations output by each oscillator in response to applying the plurality of signals to the plurality of oscillators.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are illustrated in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:
1. A method comprising:
   receiving a plurality of signals from a plurality of voltage sensors coupled with a memory die, each signal of the plurality of signals indicating a voltage at a respective area of the memory die;
   weighting each signal of the plurality of signals to generate a plurality of weighted signals, the weighting of each signal based at least in part on the respective area of the memory die associated with the signal; and adjusting a voltage level of a supply voltage used by the memory die based at least in part on the plurality of weighted signals.

2. The method of claim 1, wherein weighting each signal of the plurality of signals to generate the plurality of weighted signals comprises:

applying a respective capacitance to each signal.

3. A method comprising:

receiving a plurality of signals each indicating a voltage at a respective area of a memory die;

weighting each signal of the plurality of signals to generate a plurality of weighted signals, the weighting of each signal based at least in part on the respective area of the memory die associated with the signal;

averaging the plurality of weighted signals to generate a weighted average of the plurality of signals; and adjusting a voltage level of a supply voltage based at least in part on the plurality of weighted signals and on the weighted average of the plurality of signals.

4. A method comprising:

receiving a plurality of signals each indicating a voltage at a respective area of a memory die;

weighting each signal of the plurality of signals to generate a plurality of weighted signals, the weighting of each signal based at least in part on the respective area of the memory die associated with the signal, wherein weighting each signal of the plurality of signals to generate the plurality of weighted signals comprises:

applying each signal of the plurality of signals to a respective oscillator of a plurality of oscillators; and counting, for a respective duration, a quantity of oscillations output by each oscillator in response to applying the plurality of signals to the plurality of oscillators; and adjusting a voltage level of a supply voltage based at least in part on the plurality of weighted signals.

5. The method of claim 4, further comprising:

averaging the quantity of oscillations output by each oscillator of the plurality of oscillators to produce an average count, wherein adjusting the voltage level of the supply voltage is based at least in part on the average count.

6. The method of claim 5, further comprising:

converting the average count into an analog signal, wherein adjusting the voltage level of the supply voltage is based at least in part on the analog signal.

7. The method of claim 4, further comprising:

adjusting a weight applied to a signal of the plurality of signals by adjusting the respective duration that the quantity of oscillations output by an oscillator of the plurality of oscillators is counted.

8. The method of claim 4, wherein an oscillator of the plurality of oscillators comprises a ring oscillator.

9. A method comprising:

receiving a plurality of signals each indicating a voltage at a respective area of a memory die;

weighting each signal of the plurality of signals to generate a plurality of weighted signals, the weighting of each signal based at least in part on the respective area of the memory die associated with the signal, wherein weighting each signal of the plurality of signals to generate the plurality of weighted signals comprises applying a respective capacitance to each signal;

combining the plurality of weighted signals together to produce a weighted average of the plurality of signals; and adjusting a voltage level of a supply voltage based at least in part on the plurality of weighted signals and on the weighted average.

10. A method comprising:

receiving a plurality of signals each indicating a voltage at a respective area of a memory die;

weighting each signal of the plurality of signals to generate a plurality of weighted signals, the weighting of each signal based at least in part on the respective area of the memory die associated with the signal, wherein weighting each signal of the plurality of signals to generate the plurality of weighted signals comprises applying a respective capacitance to each signal;

adjusting a weight associated with a signal of the plurality of signals by adjusting the respective capacitance associated with the signal; and adjusting a voltage level of a supply voltage based at least in part on the plurality of weighted signals.

11. A method of comprising:

receiving a plurality of signals each indicating a voltage at a respective area of a memory die;

weighting each signal of the plurality of signals to generate a plurality of weighted signals, the weighting of each signal based at least in part on the respective area of the memory die associated with the signal;

receiving a second signal indicative of a voltage of a second memory die; and adjusting a voltage level of a supply voltage based at least in part on the plurality of weighted signals and on the second signal.

12. A method comprising:

receiving a plurality of signals each indicating a voltage at a respective area of a memory die;

weighting each signal of the plurality of signals to generate a plurality of weighted signals, the weighting of each signal based at least in part on the respective area of the memory die associated with the signal; and adjusting a voltage level of a supply voltage based at least in part on the plurality of weighted signals, wherein adjusting the voltage level of the supply voltage comprises:

sending an adjusting signal to a voltage regulator.

13. An apparatus, comprising:

a memory die;

a plurality of voltage sensors positioned at different areas of the memory die and configured to output a plurality of signals, each voltage sensor of the plurality of voltage sensors configured to output a respective signal of the plurality of signals indicating a voltage sensed at a respective area of the memory die;

a first circuit coupled with the plurality of voltage sensors and configured to:

receive the plurality of signals from the plurality of voltage sensors; and weight each signal of the plurality of signals to generate a plurality of weighted signals, the weighting of each signal based at least in part on the respective area of the memory die associated with the signal; and a voltage regulator coupled with the first circuit and configured to:

provide a supply voltage to the memory die; and adjust a voltage level of the supply voltage based at least in part on the plurality of weighted signals.

14. The apparatus of claim 13, further comprising:
a second circuit coupled with the first circuit and the voltage regulator and configured to average the plurality of weighted signals to generate a weighted average of the plurality of signals, wherein the voltage regulator is configured to adjust the voltage level of the supply voltage based at least in part on the weighted average of the plurality of signals.

15. The apparatus of claim 13, wherein the first circuit comprises:
a plurality of oscillators, each configured to:
receive a respective signal of the plurality of signals; and
weight the respective signal by outputting a quantity of oscillations for a respective duration.

16. The apparatus of claim 15, further comprising:
a second circuit coupled with the plurality of oscillators and the voltage regulator and configured to produce an average count by averaging the quantity of oscillations output by each oscillator of the plurality of oscillators, wherein the voltage regulator is configured to adjust the voltage level of the supply voltage based at least in part on the average count.

17. The apparatus of claim 16, further comprising:
a digital-to-analog converter coupled with the second circuit and the voltage regulator and configured to convert the average count into an analog signal, wherein the voltage regulator is configured to adjust the voltage level of the supply voltage based at least in part on the analog signal.

18. The apparatus of claim 15, wherein the weighting of each signal is based at least in part on the respective duration that the quantity of oscillations output by the oscillator are counted.

19. The apparatus of claim 15, wherein the plurality of oscillators comprises a plurality of ring oscillators.

20. The apparatus of claim 13, wherein the first circuit comprises:
a plurality of capacitive circuits, each configured to receive a respective signal of the plurality of signals, wherein the weighting of each signal is based at least in part on a capacitance of the respective capacitive circuit.

21. The apparatus of claim 20, further comprising:
a second circuit coupled with the plurality of capacitive circuits and the voltage regulator and configured to combine the plurality of weighted signals together to produce a weighted average of the plurality of signals, wherein the voltage regulator is configured to adjust the voltage level of the supply voltage based at least in part on the weighted average.

22. The apparatus of claim 13, further comprising:
a second memory die; and
a second voltage sensor positioned on the second memory die and coupled with the voltage regulator and configured to output a second signal indicating a second voltage sensed at the second memory die, wherein the voltage regulator is configured to adjust the voltage level of the supply voltage based at least in part on the second signal.

23. An apparatus, comprising:
a memory die;
a power circuit coupled with the memory die and configured to provide one or more voltages to the memory die; and
a controller coupled with the memory die and the power circuit, the controller configured to cause the power circuit to:
receive a plurality of signals from a plurality of voltage sensors coupled with the memory die, each signal of the plurality of signals indicating a voltage at an area of the memory die;
weight each signal of the plurality of signals to generate a plurality of weighted signals based at least in part on the area of the memory die; and
adjust a voltage level of a supply voltage used by the memory die based at least in part on the plurality of weighted signals.

24. The apparatus of claim 23, wherein the controller is further configured to cause the power circuit to:
average the plurality of weighted signals to generate a weighted average of the plurality of signals, wherein adjusting the voltage level of the supply voltage is based at least in part on the weighted average of the plurality of signals.

25. The apparatus of claim 23, wherein the controller is further configured to cause the power circuit to:
apply each signal of the plurality of signals to a respective oscillator of a plurality of oscillators; and
count, for a respective duration, a quantity of oscillations output by each oscillator in response to applying the plurality of signals to the plurality of oscillators.

* * * * *